(12) United States Patent
Leirer et al.

(10) Patent No.: US 9,853,018 B2
(45) Date of Patent: Dec. 26, 2017

(54) OPTOELECTRONIC SEMICONDUCTOR CHIP AND OPTOELECTRONIC COMPONENT

(71) Applicant: OSRAM Opto Semiconductors GmbH, Regensburg (DE)

(72) Inventors: Christian Leirer, Friedberg (DE); Berthold Hahn, Hemau (DE); Roland Zeisel, Tegernheim (DE); Johannes Baur, Regensburg (DE); Karl Engl, Pentling (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/021,393

(22) PCT Filed: Sep. 10, 2014

(86) PCT No.: PCT/EP2014/069314
§ 371 (c)(1),
(2) Date: Mar. 11, 2016

(87) PCT Pub. No.: WO2015/036443
PCT Pub. Date: Mar. 19, 2015

(65) Prior Publication Data
US 2016/0225749 A1    Aug. 4, 2016

(30) Foreign Application Priority Data
Sep. 12, 2013  (DE) .................. 10 2013 110 041

(51) Int. Cl.
*H01L 33/62* (2010.01)
*H01L 25/16* (2006.01)
(Continued)

(52) U.S. Cl.
CPC ........ *H01L 25/167* (2013.01); *H01L 25/0753* (2013.01); *H01L 27/15* (2013.01);
(Continued)

(58) Field of Classification Search
CPC . H01L 25/0753; H01L 27/156; H01L 33/382; H01L 33/483; H01L 33/62
See application file for complete search history.

(56) References Cited

U.S. PATENT DOCUMENTS 6,490,381 B1 * 12/2002 Adair ................ G02F 1/21
                                                   385/16
6,956,747 B1    10/2005 Shigyo et al.
(Continued)

FOREIGN PATENT DOCUMENTS

DE    102008016525 A1    11/2009
WO    2006129291 A2    12/2006
(Continued)

*Primary Examiner* — Stephen W Smoot
(74) *Attorney, Agent, or Firm* — Slater Matsil, LLP

(57) ABSTRACT

An optoelectronic semiconductor chip includes a semiconductor layer sequence. The semiconductor layer sequence includes a first semiconductor region of a first conductivity type, a second semiconductor region of a second conductivity type, and an active zone having a p-n junction, which active zone is formed between the first semiconductor region and the second semiconductor region. The semiconductor layer sequence is arranged on a carrier. The semiconductor chip also includes a first contact, which is provided for electrically connecting the first semiconductor region, and a second contact, which is different from the first contact and which is provided for electrically connecting the second semiconductor region. In addition, the semiconductor chip includes a first capacitive electrical element, which is connected in parallel with the p-n junction and which has a first dielectric element.

18 Claims, 9 Drawing Sheets

(51) Int. Cl.
  *H01L 27/15*   (2006.01)
  *H01L 25/075*  (2006.01)
  *H01L 33/38*   (2010.01)
  *H01L 33/48*   (2010.01)

(52) U.S. Cl.
  CPC .......... *H01L 27/156* (2013.01); *H01L 33/382* (2013.01); *H01L 33/483* (2013.01); *H01L 33/62* (2013.01); *H01L 2224/16225* (2013.01); *H01L 2224/48091* (2013.01); *H01L 2224/48227* (2013.01); *H01L 2224/48479* (2013.01); *H01L 2924/0002* (2013.01); *H01L 2933/0016* (2013.01)

(56) References Cited

U.S. PATENT DOCUMENTS

| | | | |
|---|---|---|---|
| 7,622,746 B1* | 11/2009 | Lester | H01L 33/387 257/98 |
| 7,830,095 B2* | 11/2010 | Erhardt | H01G 4/40 315/209 R |
| 8,653,540 B2 | 2/2014 | Engl et al. | |
| 9,029,177 B2 | 5/2015 | Butendeich et al. | |
| 9,166,111 B2 | 10/2015 | Matsui et al. | |
| 9,202,978 B2 | 12/2015 | Löffler et al. | |
| 2008/0258257 A1 | 10/2008 | Klee et al. | |
| 2010/0118530 A1* | 5/2010 | Nagai | H01L 25/0753 362/235 |
| 2010/0171135 A1* | 7/2010 | Engl | H01L 33/382 257/98 |
| 2010/0270566 A1* | 10/2010 | Cheng | H01L 33/46 257/89 |
| 2012/0074441 A1* | 3/2012 | Seo | H01L 27/153 257/91 |
| 2015/0034963 A1* | 2/2015 | Kinouchi | H01L 33/20 257/76 |

FOREIGN PATENT DOCUMENTS

| | | |
|---|---|---|
| WO | 2008131735 A1 | 11/2008 |
| WO | 2011080219 A1 | 7/2011 |
| WO | 2012091042 A1 | 7/2012 |
| WO | 2012146668 A1 | 11/2012 |

\* cited by examiner

OPTOELECTRONIC SEMICONDUCTOR CHIP AND OPTOELECTRONIC COMPONENT This patent application is a national phase filing under section 371 of PCT/EP2014/069314, filed Sep. 10, 2014, which claims the priority of German patent application 10 2013 110 041.4, filed Sep. 12, 2013, each of which is incorporated herein by reference in its entirety.

TECHNICAL FIELD

An optoelectronic semiconductor chip and an optoelectronic component are specified.

BACKGROUND

Optoelectronic semiconductor chips are described, for example, in the following documents: WO 2011/080219, WO 2012/146668, WO 2008/131735, also published as U.S. Pat. No. 9,029,177, U.S. Pat. No. 9,202,978, and U.S. Pat. No. 8,653,540, respectively.

SUMMARY

Embodiments of the invention specify an optoelectronic semiconductor chip having increased ESD protection (ESD stands for "electrostatic discharge"). Further embodiments specify an optoelectronic component which likewise has increased ESD protection.

An optoelectronic semiconductor chip comprises a semiconductor layer sequence having a first semiconductor region of a first conductivity type and a second semiconductor region of a second conductivity type. The first conductivity type is different than the second conductivity type. By way of example, the first conductivity type is n-conducting and the second conductivity type is p-conducting. In the case of an n-conducting material, the electrical conductivity is based on mobile electrons, while in the case of a p-conducting material, the electrical conductivity is based on mobile holes.

Furthermore, the semiconductor layer sequence comprises an active zone having a pn junction, wherein the active zone is formed between the first semiconductor region and the second semiconductor region. The semiconductor layer sequence can be grown completely or partly epitaxially.

The semiconductor layer sequence is preferably arranged on a carrier. The carrier can be, for example, a growth substrate on which the semiconductor layer sequence was grown epitaxially. By way of example, such a growth substrate can comprise sapphire or consist of sapphire.

Furthermore, it is also possible for the carrier to be different than a growth substrate of the semiconductor layer sequence. By way of example, the semiconductor layer sequence can be grown epitaxially on a growth substrate and can then be transferred to a carrier. For this purpose, a free main surface of the semiconductor layer sequence facing away from the growth substrate is fixed to a carrier, for example, by means of an adhesive or a solder. Afterward, the growth substrate is removed from the semiconductor layer sequence or thinned in such a way that the growth substrate by itself no longer sufficiently mechanically stabilizes the semiconductor layer sequence. Such a semiconductor chip is also referred to as a thin-film chip. Preferably, in the case of a thin-film chip, a reflective layer is arranged between the semiconductor layer sequence and the carrier. The reflective layer is provided for directing radiation generated in the active zone to a radiation exit surface of the semiconductor chip.

Furthermore, the optoelectronic semiconductor chip comprises a first contact, which is provided for electrically connecting the first semiconductor region, and a second contact, which is different than the first contact and which is provided for electrically connecting the second semiconductor region.

Furthermore, a first capacitive electrical element is connected in parallel with the pn junction and is suitable for taking up at least part of the charge of the overvoltage in the case of an overvoltage in the reverse direction of the pn junction. In this case, the capacitive electrical element is preferably monolithically integrated into the optoelectronic semiconductor chip. The first capacitive element advantageously increases the ESD protection of the semiconductor chip.

The first capacitive element comprises at least one dielectric element which, with at least one part of one of the electrical contacts, acts as an electrical capacitance.

In accordance with one embodiment, the first contact and the second contact are electrically isolated from one another by the dielectric element.

In accordance with a further embodiment, the optoelectronic semiconductor chip comprises a second capacitive element. The second capacitive element is particularly preferably connected in parallel with the first capacitive element and the pn junction. The second capacitive element is also suitable for taking up at least part of the charge of the overvoltage in the case of an overvoltage in the reverse direction of the pn junction. The second capacitive element advantageously increases the ESD protection of the semiconductor chip further. The features, properties and embodiments described for the first capacitive element are also applicable to the second capacitive element.

The first and/or the second capacitive electrical element contribute(s) to at least reducing an overvoltage of the pn junction. The capacitive electrical element connected in parallel with the pn junction takes up at least part of the charge flowing via the pn junction in the case of an electrostatic discharge of the semiconductor chip and thus reduces the charge acting on the pn junction. Furthermore, the capacitive electrical element has the effect that the charge of the electrostatic discharge is emitted to the pn junction in a retarded manner. The current density present at the pn junction on account of the electrostatic discharge is thus reduced, particularly in the initial phase of the electrostatic discharge. This reduces the power dissipated in the pn junction and thus reduces the probability of the pn junction being damaged or destroyed during the electrostatic discharge.

The first capacitive electrical element preferably comprises a first dielectric layer as dielectric element. The first capacitive element can also comprise a dielectric layer sequence. By way of example, the first capacitive electrical element is formed by the first contact, the second contact and the first dielectric layer, wherein the first dielectric layer is arranged between the first contact and the second contact and electrically insulates them from one another.

It is likewise possible for the second capacitive electrical element to comprise a second dielectric layer. By way of example, the second dielectric layer is part of a layer sequence.

In accordance with one embodiment of the semiconductor chip, the first contact comprises a first contact layer and the second contact comprises a second contact layer. The first capacitive element comprises the first dielectric layer. The first capacitive element comprises the first contact layer, the second contact layer and the first dielectric layer or is formed from the first contact layer, the second contact layer and the first dielectric layer. The first contact layer, the second contact layer and the first dielectric layer are arranged one above another. The first dielectric layer is furthermore positioned between the first contact layer and the second contact layer. Particularly preferably, the first contact layer, the second contact layer and the first dielectric layer are arranged one above another in such a way that they at least partly overlap laterally. The first dielectric layer is particularly preferably in direct contact with the first contact layer and the second contact layer.

In this embodiment, the first contact layer, the second contact layer and the first dielectric layer form a capacitor, the capacitance C of which is calculated according to the formula $C=(A*\epsilon_r*\epsilon_0)/d$, wherein $\epsilon_r$ is the dielectric constant of the first dielectric layer, d is the thickness of the dielectric layer and A is the area along which the first contact layer, the second contact layer and the first dielectric layer overlap one another.

In accordance with a further embodiment, the optoelectronic semiconductor chip comprises, alongside the first contact comprising a first contact layer, a second contact comprising at least one second contact element, which penetrates through the first contact layer and the pn junction. With the aid of the second contact element, the semiconductor region facing away from a rear side of the semiconductor chip can advantageously be electrically contacted via the rear side. The rear side of the semiconductor chip is provided, for example, for mounting the semiconductor chip onto a submount. In particular, the rear side of the semiconductor chip does not comprise a radiation exit surface. The rear side of the semiconductor chip is situated opposite a front side of the semiconductor chip, said front side comprising a radiation exit surface of the semiconductor chip.

In accordance with one embodiment, the first capacitive element comprises a first dielectric layer and the second contact comprises a second contact element. In this case, the first dielectric layer covers a side flank of the second contact element. By way of example, the first capacitive element is formed from a first dielectric layer, which is arranged between the first contact layer of the first contact and the second contact layer of the second contact and extends right over a side flank of the second contact element. The second dielectric layer of a second capacitive element can also cover a side flank of the second contact element.

By way of example, the first capacitive electrical element and the second capacitive electrical element in each comprise a dielectric layer as dielectric element. Particularly preferably, the first dielectric layer is arranged between the first contact layer and the second contact layer and the second dielectric layer is arranged between the second contact layer and the semiconductor layer sequence. In this case, the second contact can comprise a second contact element, wherein the first dielectric layer extends over a side flank of the second contact element and the second dielectric layer extends over a further side flank of the second contact element. In this case, the two side flanks of the contact element are particularly preferably situated opposite one another.

In accordance with a further embodiment, the first contact comprises a first connection element, which is arranged on the front side of the semiconductor chip. The second contact can also comprise a second connection element, which is preferably likewise arranged on a front side of the semiconductor chip.

The first connection element and/or the second connection element are/is provided for electrically contacting the optoelectronic semiconductor chip toward the outside, for example, with the aid of a bonding wire.

If the front side of the semiconductor chip has a single connection element, then the other electrical contact can be electrically contacted externally via the rear side of the semiconductor chip. By way of example, the rear side of the semiconductor chip is formed by a main surface of the carrier. If the semiconductor chip is intended to be electrically contacted at the rear side, then the carrier is preferably embodied in an electrically conductive fashion. Furthermore, the carrier is particularly preferably fixed to the semiconductor layer sequence by an electrically conductive material, for example, by a solder or an electrically conductive adhesive.

In accordance with one embodiment, the first and/or second dielectric element are/is formed from at least one of the following materials: oxide, nitride, oxynitride, silicon oxynitride ($\epsilon_r \approx 6-7$), hafnium nitride ($\epsilon_r \approx 20-40$), hafnium oxynitride ($\epsilon_r \approx 20-40$), hafnium silicon oxynitride ($\epsilon_r \approx 20-40$), zirconium oxynitride ($\epsilon_r \approx 20-40$), zirconium silicon oxynitride ($\epsilon_r \approx 20-40$), tantalum oxide ($\epsilon_r \approx 25$), barium strontium titanate ($\epsilon_r > 200$), strontium titanate ($\epsilon_r \approx 400$), silicon oxide ($\epsilon_r \approx 3.9$), hafnium oxide ($\epsilon_r \approx 20-40$), titanium oxide, silicon nitride, aluminum oxide ($\epsilon_r \approx 8-9$), zirconium oxide ($\epsilon_r \approx 20-40$). Particularly preferably, the first dielectric element and/or the second dielectric element, such as, for example, the first dielectric layer and/or the second dielectric layer, comprise(s) a material having the highest possible dielectric constant.

Particularly preferably, the thickness of the first dielectric layer and/or of the second dielectric layer has a value of between 1 nanometer and 1000 nanometers inclusive.

The first dielectric element and/or the second dielectric element can be deposited, for example, by atomic layer deposition (ALD), or with the aid of tetraethoxysilane (TEOS).

Atomic layer deposition in the present case denotes a method in which a first gaseous starting material is fed to a volume in which the surface to be coated is provided, such that the first gaseous starting material adsorbs on the surface. After preferably complete or almost complete coverage of the surface with the first starting material, that part of the first starting material which is still present in gaseous form or such that it has not adsorbed on the surface is generally removed again from the volume and a second starting material is fed in. The second starting material is provided for chemically reacting with the first starting compound adsorbed at the surface to form a solid ALD layer.

In accordance with a further embodiment, the first and/or the second dielectric element comprise(s) a multiplicity of structure elements that are interconnected. By way of example, the structure elements can be embodied as cylinders or cuboids. By way of example, the structure elements are arranged between the first contact layer and the semiconductor layer sequence. Furthermore, the structure elements can also be arranged between the second contact layer and the semiconductor layer sequence.

Furthermore, it is also possible for the semiconductor chip to comprise a multiplicity of dielectric structure elements that form a third dielectric element of a third capacitive element. The third capacitive element is particularly preferably connected in parallel with the pn junction and/or with the first capacitive element and/or the second capacitive element.

The features, properties and embodiments described for the first and second capacitive elements are also applicable to the third capacitive element.

With the aid of the first capacitive element and/or the second capacitive element and/or the third capacitive element, capacitances of between 1 picofarad and 1 nanofarad can preferably be generated with in the semiconductor chip.

In accordance with one embodiment, the semiconductor chip comprises a plurality of semiconductor layers connected in series. Particularly preferably, the semiconductor layer sequences are arranged laterally alongside one another on a common carrier.

By way of example, the carrier is embodied in a radiation-transmissive fashion and one of its main surfaces comprises a radiation exit surface. In other words, in this embodiment the carrier is provided to the effect that the electromagnetic radiation generated in the active zone passes through the carrier and is emitted from the outer surface thereof. In this embodiment, the semiconductor chip is particularly preferably electrically contacted only via its rear side. Such a semiconductor chip is also referred to as flip-chip.

Alternatively, it is also possible for the carrier to face away from a radiation exit surface of the semiconductor chip. Such a semiconductor chip is preferably a thin-film semiconductor chip. In this case, the carrier is preferably embodied in a light-nontransmissive fashion and particularly preferably has an increased thermal conductivity. By way of example, the carrier is formed from a metal. The carrier can also be deposited galvanically.

The optoelectronic semiconductor chip described here is provided for being part of an optoelectronic component. By way of example, the optoelectronic component comprises a submount. Preferably, a further capacitive element is integrated into the submount. The further capacitive element is preferably likewise connected in parallel with the semiconductor chip and advantageously increases the ESD protection of the pn junction.

By way of example, the further capacitive element of the submount comprises at least one dielectric layer. The materials already mentioned for the first capacitive element are suitable as materials.

Furthermore, it is also possible for the further capacitive element to comprise a layer stack of alternating metallic and dielectric layers.

BRIEF DESCRIPTION OF THE DRAWINGS

Further advantageous embodiments and developments of the invention will become apparent from the exemplary embodiments described below in association with the figures.

Elements that are identical, of identical type or act identically are provided with the same reference signs in the figures. The figures and the size relationships of the elements illustrated in the figures among one another should not be regarded as to scale. Rather, individual elements, in particular layer thicknesses, may be illustrated with exaggerated size in order to enable better illustration and/or in order to afford a better understanding.

DETAILED DESCRIPTION OF ILLUSTRATIVE EMBODIMENTS

Figure 1:
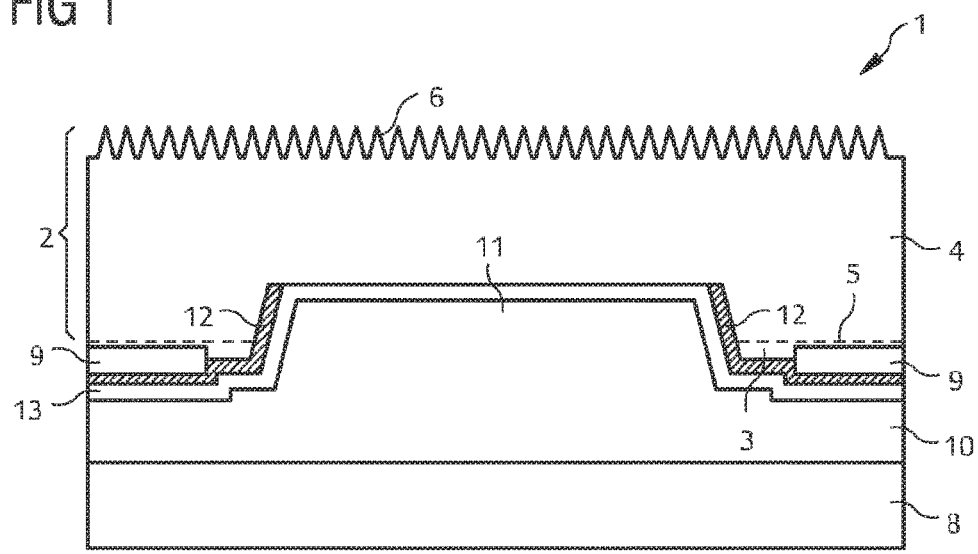
FIGS. 1 to 3 show in each case a schematic sectional illustration of an electronic semiconductor chip in accordance with one exemplary embodiment.

The optoelectronic semiconductor chip 1 in accordance with the exemplary embodiment in FIG. 1 comprises a semiconductor layer sequence 2 having a first semiconductor region 3 of a first conductivity type and a second semiconductor region 4 of a second conductivity type. In the present exemplary embodiment, the first semiconductor region 3 is p-conductive and the second semiconductor region 4 is n-conductive. An active zone having a pn junction 5 is formed between the first semiconductor region 3 and the second semiconductor region 4. During the operation of the semiconductor chip 1, the active zone generates electromagnetic radiation that is emitted by a radiation exit surface 6 of the semiconductor chip 1. The radiation exit surface 6 of the semiconductor chip 1 has a structuring that is intended to result in increased coupling-out of radiation from the semiconductor chip 1. The radiation exit surface 6 is part of a front side 7 of the semiconductor chip 1.

Furthermore, the semiconductor chip 1 comprises a carrier 8, on which the semiconductor layer sequence 2 is arranged. In the present exemplary embodiment, the carrier 8 is embodied as electrically conductive. By way of example, the carrier 8 can be fixed to the semiconductor layer sequence 2 by a solder or an electrically conductive adhesive. Alternatively, the carrier 8 can also be deposited galvanically. In the present case, the carrier 8 faces away from the radiation exit surface 6 of the semiconductor chip 1.

The semiconductor chip 1 furthermore comprises a first electrical contact, which is provided for electrically connecting the first semiconductor region 3. In the present case, the first contact comprises a first contact layer 9, which is arranged in direct contact with the first semiconductor region 3. Furthermore, the semiconductor chip 1 comprises a second contact comprising a second contact layer 10 and a second contact element 11. In this case, the second contact element 11 completely penetrates through the first contact layer and the pn junction and extends as far as the second semiconductor region 4 of the second conductivity type in order to be able to make electrical contact therewith. The first contact layer 9 and the second contact layer 10 are arranged one above another and overlap laterally.

The first contact layer 9 and the second contact layer 10 are separated from one another by a first dielectric element. The first dielectric element is embodied as a first dielectric layer 12, which is arranged between the first contact layer 9 and the second contact layer 10 and is in direct contact with the first contact layer 9. The first dielectric layer 12 together with the first contact layer 9 and the second contact layer 10 forms a first capacitive element. The first capacitive element is suitable for taking up electrical charge if an overvoltage is present at the pn junction 5 in the reverse direction.

Furthermore, the dielectric element extends over side flanks of the second contact element 11. The first dielectric element here is in direct contact with the first semiconductor region 3 and electrically insulates the second contact element 11 from the first semiconductor region 3. The first dielectric element is likewise embodied as a layer in the region of the second contact element 11, but the thickness of said layer is increased compared with the remaining region.

In the present case, the first contact layer 9 is embodied as reflective. A reflective, electrically conductive layer 13 formed from a metal, for example, is applied over the whole area on the second contact layer 10 and on the second contact element 11. By means of the reflective first contact layer and the reflective layer 13, electromagnetic radiation generated in the active zone can be directed to the radiation exit surface 6.

Figure 2:
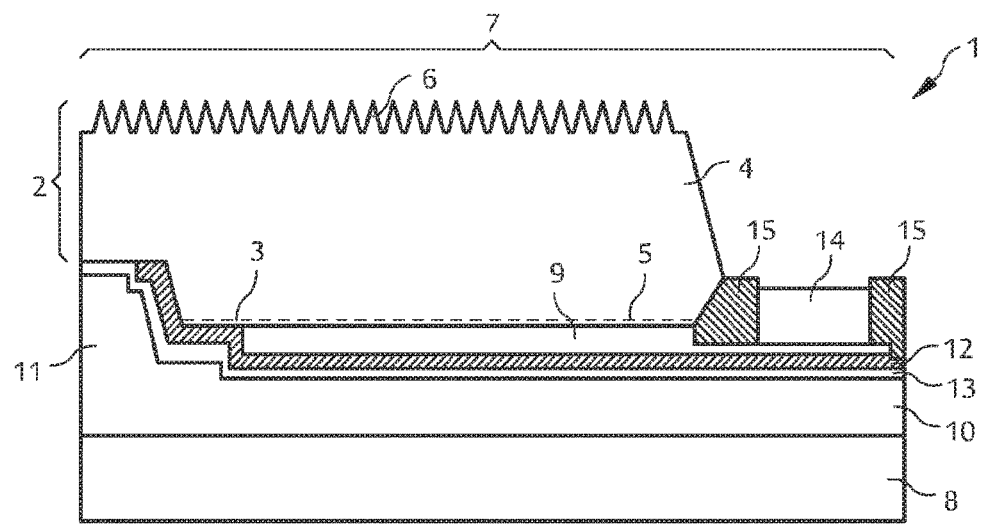

FIG. 1 schematically shows an excerpt from the semiconductor chip 1 comprising the first contact element 11. FIG. 2 schematically shows a further excerpt from the semiconductor chip 1. This excerpt illustrates, in particular, the two contact layers 9, 10 and a first connection element 14. FIG. 2 laterally reveals a part of the second contact element 11, which is illustrated completely in FIG. 1. Furthermore, FIG. 2 shows the first contact layer 9 and the second contact layer 10, which are separated from one another by the first dielectric layer 12. In this case, the dielectric layer directly adjoins the first contact layer 9 and directly adjoins the reflective layer 13.

Furthermore, the first contact comprises the first connection element 14, which is arranged laterally with respect to the semiconductor layer sequence 2 on the front side 7 of the semiconductor chip 1. The first connection element 14 is provided for electrically contacting the semiconductor chip 1 externally, for example, via a bonding wire. The first connection element 14 is laterally enclosed by electrically insulating elements 15 and is thereby electrically insulated from the semiconductor layer sequence 2. The first connection element 14 is in direct contact with the first contact layer 9.

Figure 3:
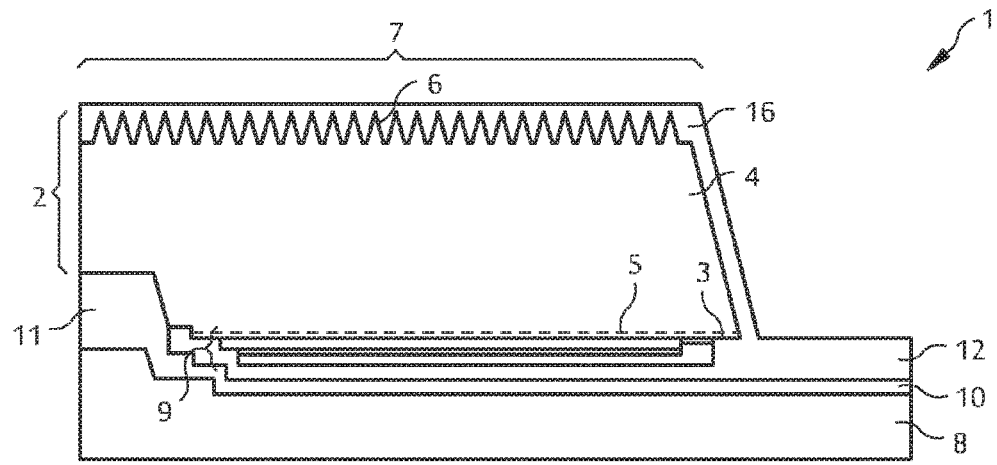

The semiconductor chip 1 in accordance with the exemplary embodiment in FIG. 3 comprises a carrier 8 formed from germanium. A semiconductor layer sequence 2 is arranged on the carrier 8, said semiconductor layer sequence being based on gallium nitride and having a first p-doped semiconductor region 3 and a second n-doped semiconductor region 4.

Gallium nitride is a nitride compound semiconductor material. Nitride compound semiconductor materials are compound semiconductor materials containing nitrogen and comply with the following chemical empirical formula:

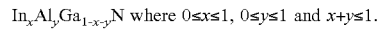

$In_xAl_yGa_{1-x-y}N$ where $0 \le x \le 1$, $0 \le y \le 1$ and $x+y \le 1$.

An active zone having a pn junction 5 is arranged between the p-doped semiconductor region 3 and the n-doped semiconductor region 4. In this case, the n-doped semiconductor region 4 faces toward a radiation exit surface 6 of the semiconductor chip 1, while the p-doped semiconductor region 3 faces toward the carrier 8.

The semiconductor chip 1 comprises a first contact layer 9, which is in direct contact with the first semiconductor region 3 and is provided for electrically contacting the first semiconductor region 3.

Figure 4:
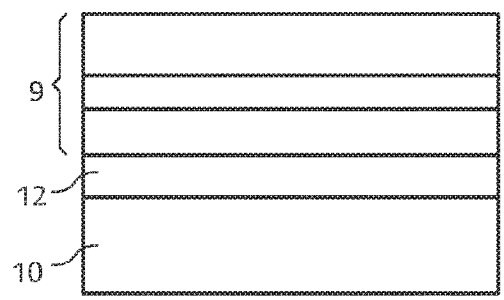
FIG. 4 shows an excerpt from FIG. 3.

The semiconductor chip 1 furthermore comprises a second contact comprising a second contact layer 10 and a second contact element 11. The contact element 11 completely penetrates through the first contact layer 9 and the pn junction 5. A first dielectric layer 12 is formed between the first contact layer 9 and the second contact layer 10, said first dielectric layer being part of a first capacitive element. In the present case, the first contact layer 9 is formed from three individual layers, as illustrated in detail in FIG. 4.

In the present case, a passivation layer 16 formed from silicon dioxide is furthermore formed on the front side 7 and also on the side flank of the semiconductor layer sequence 2 and on an edge region of the second contact layer 10.

Figure 5:
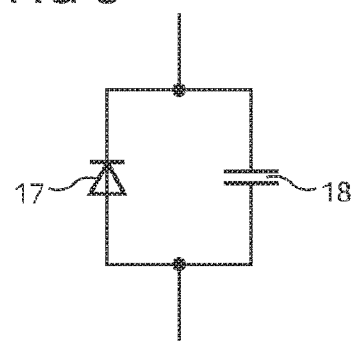
FIG. 5 shows an equivalent circuit diagram of the semiconductor chip in accordance with the exemplary embodiment of FIGS. 3 and 4.

The first dielectric layer 12 and the two contact layers 9, 10 form a first capacitive element, which in the present case is connected in parallel with the pn junction 5. The corresponding equivalent circuit diagram is illustrated in FIG. 5. In this case, the diode signal 17 symbolizes the pn junction 5, and the capacitor symbol 18 symbolizes the first capacitive element.

Figure 6:
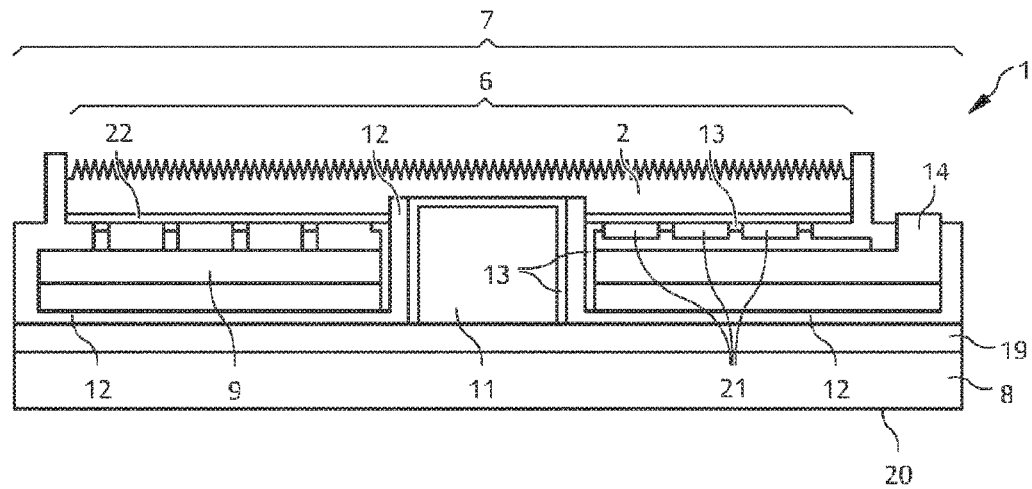
FIG. 6 shows a schematic sectional illustration of a semiconductor chip in accordance with a further exemplary embodiment.

The semiconductor chip 1 in accordance with the exemplary embodiment in FIG. 6 comprises a carrier 8 embodied as electrically conductive. The electrically conductive carrier 8 is fixed to a semiconductor layer sequence 2 by an electrically conductive connecting layer 19, for example, a solder or adhesive layer. The semiconductor layer sequence 2 has a first p-doped semiconductor region 3 and a second n-doped semiconductor region 4. The first semiconductor region 3 faces toward the carrier and the second semiconductor region 4 faces toward a radiation exit surface 6 of the semiconductor chip 1. An active zone comprising a pn junction 5 is arranged between the first semiconductor region 3 and the second semiconductor region 4. The active zone, the pn junction 5 and the two semiconductor regions 3, 4 are not illustrated in FIG. 6 for reasons of clarity.

Furthermore, the semiconductor chip 1 in accordance with FIG. 6 comprises a first contact layer 9, which is provided for electrically contacting the p-doped semiconductor region 3. In this case, the first contact layer 9 extends, apart from a region formed by a second contact element 11, completely along a main surface of the carrier 8. The first contact comprises, alongside the first contact layer 9, a first connection element 14, which is in direct contact with the first contact layer 9 and is provided for electrically contacting the semiconductor chip 1 externally. The first connection element 14 is arranged on a front side 7 of the semiconductor chip 1.

A second contact element 11 penetrates completely through the first contact layer 9 and is provided for electrically contacting the n-doped semiconductor region 4. In the exemplary embodiment in FIG. 6, the second electrical contact is formed by the second contact element 11. In particular, in the present case, the second contact is free of a second contact layer 10. The second contact element 11 connects the electrically conductive carrier 8 to the n-doped semiconductor region 4. The semiconductor chip 1 can therefore be electrically contacted later via its rear side 20 situated opposite the front side 7.

A first dielectric layer 12 is arranged between the electrically conductive carrier 8 and the first contact layer 9. The first dielectric layer 12, the electrically conductive carrier 8 and the first contact layer 9 form a first capacitive element, which is connected in parallel with the pn junction 5.

The first dielectric layer 12 furthermore extends over the side flanks of the second contact element 11 and at least partly over side flanks of the optoelectronic semiconductor chip 1. In this regard, the first dielectric layer 12 covers the side surfaces of the first contact layer 9 and of the semiconductor layer sequence 2.

Furthermore, a multiplicity of structure elements 21 formed from a dielectric material are arranged between the first contact layer 9 and the semiconductor layer sequence 2. By way of example, the structure elements 21 are formed from the same dielectric material as the first dielectric layer 12 of the capacitive element. The multiplicity of dielectric structure elements 21 can likewise contribute to the first capacitive element or themselves—in interaction with electrically conductive elements of the semiconductor chip 1—form a further capacitive element.

Furthermore, a current impressing layer 22 is arranged over the whole area between the dielectric structure elements 21 and the semiconductor layer sequence 2. The current impressing layer 22 can be formed, for example, from a transparent conductive oxide (TCO).

Transparent conductive oxides are generally metal oxides such as, for example, zinc oxide, tin oxide, cadmium oxide, titanium oxide, indium oxide or indium tin oxide (ITO). Alongside binary metal-oxygen compounds such as, for example, $ZnO$, $SnO_2$ or $In_2O_3$, ternary metal-oxygen compounds such as, for example, $ZnSnO_4$, $ZnSnO_3$, $MgIn_2O_4$, $GaInO_3$, $Zn_2In_2O_5$ or $In_4Sn_3O_{12}$ or mixtures of different transparent conductive oxides also belong to the group of TCOs. Furthermore, the TCOs do not necessarily correspond to a stoichiometric composition and can furthermore also be p- and n-doped.

A reflective metallic layer 13 is applied in each case below the first dielectric layer 12 and on the first dielectric layer 12 on the side flanks of the second contact element 11. In this case, the reflective metallic layer 13 below the first dielectric layer 12 extends over the whole area over a front side of the second contact element 11, wherein the front side of the second contact element 11 faces toward a front side 7 of the semiconductor chip 1. A reflective metallic layer 13 is likewise formed in the interspaces between the dielectric structure elements 21.

Figure 7:
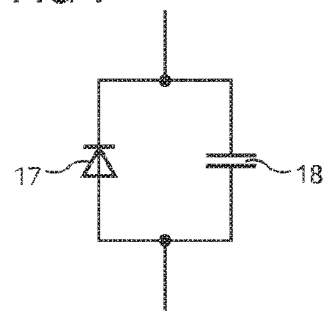
FIG. 7 shows an equivalent circuit diagram of the semiconductor chip in accordance with the exemplary embodiment in FIG. 6.

The equivalent circuit diagram of the semiconductor chip 1 in accordance with the exemplary embodiment in FIG. 6 is illustrated in FIG. 7. In this case, the diode symbol 17 once again symbolizes the pn junction 5 and the capacitor symbol 18 symbolizes the first capacitive element. The first capacitive element is connected in parallel with the pn junction 5.

Figure 8:
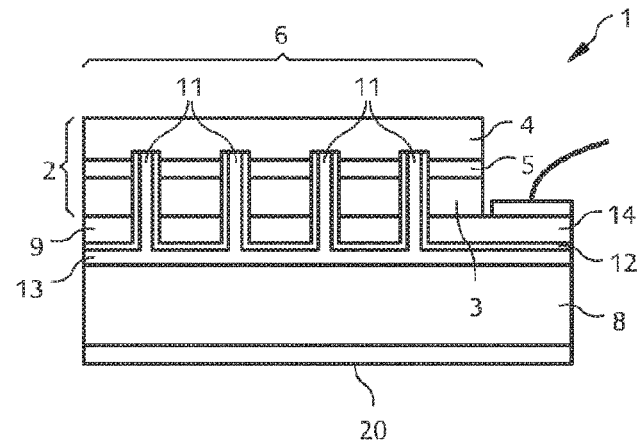
FIGS. 8 and 9 show schematic sectional illustrations of a semiconductor chip in accordance with two exemplary embodiments.

In contrast to the semiconductor chip in accordance with the exemplary embodiment in FIG. 6, the second contact of the semiconductor chip 1 in accordance with the exemplary embodiment in FIG. 8 comprises a multiplicity of second contact elements 11, which in each case completely penetrate through the first contact layer and the pn junction. The remaining elements of the semiconductor chip 1 in accordance with FIG. 8 can be embodied as in the case of the semiconductor chip in accordance with FIG. 6.

Figure 9:
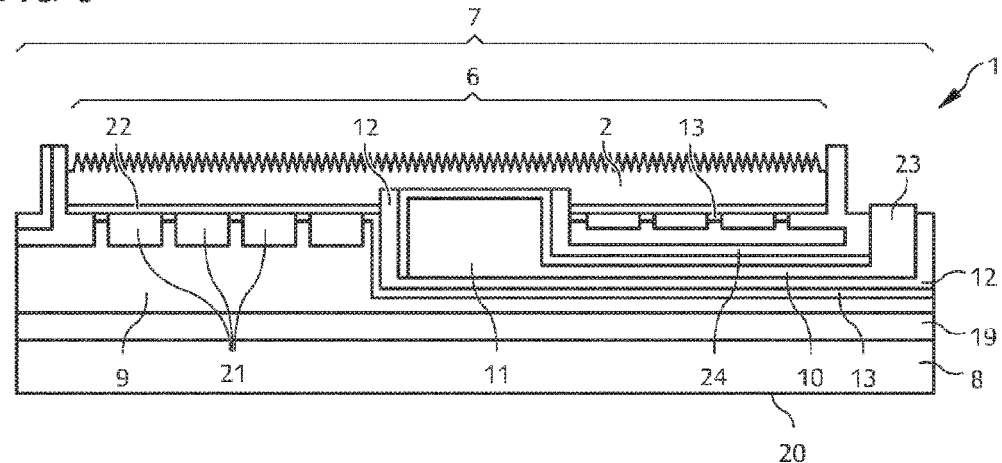

The semiconductor chip 1 in accordance with the exemplary embodiment in FIG. 9 comprises a semiconductor layer sequence 2 having a first p-doped semiconductor region 3 and a second n-doped semiconductor region 4. An electrically conductive carrier 8 is fixed to the semiconductor layer sequence 2 by a solder or adhesive layer 19. Furthermore, a first contact layer 9 formed from a reflective metal is arranged between the carrier 8 and the semiconductor layer sequence 2. In the present case, the first contact is formed from the first contact layer 9 and can be electrically contacted on the rear side via the electrically conductive carrier 8.

Furthermore, the optoelectronic semiconductor chip 1 in accordance with the exemplary embodiment in FIG. 9 comprises a second contact for electrically contacting the second n-doped semiconductor region 4. The second contact comprises a second contact layer 10, a second contact element 11 and a second connection element 23. The second contact element 11 completely penetrates through the first contact layer 9 and the pn junction 5. The second contact layer 10 is arranged between the first contact layer 9 and the semiconductor layer sequence 2 and connects the second contact element 11 and the second connection element 23 to one another. In this case, the second contact layer 10 extends only between the second contact element 11 and the laterally arranged second connection element 23 along a main side of the carrier 8, while a further region along the main side of the carrier 8 remains free of the second contact layer 10.

Furthermore, a first dielectric layer 12 is arranged between the first contact layer 9 and the second contact layer 10. In this case, the first dielectric layer 12 together with the first contact layer 9 and the second contact layer 10 forms a first capacitive element, which is connected in parallel with the pn junction 5. The first capacitive element is suitable for taking up at least part of the charge of the overvoltage in the case of an overvoltage in the reverse direction of the pn junction 5. In this case, the first dielectric layer 12 extends right over a side flank of the second contact element 11 and right over an outer side flank of the second connection element 23.

Furthermore, the optoelectronic semiconductor chip 1 in accordance with FIG. 9 comprises a second capacitive element comprising a second dielectric layer 24. In the present case, the second dielectric layer 24 is arranged between the second contact layer 10 and the semiconductor layer sequence 2 and covers a further side flank of the second contact element 11 and a further side flank of the second connection element 23. Furthermore, dielectric structure elements 21 such as have already been described with reference to FIG. 6 are arranged between the semiconductor layer sequence 2 and the carrier 8. The semiconductor chip 1 in accordance with FIG. 9 furthermore likewise comprises a current impressing layer 22 such as has been described in detail with reference to FIG. 6.

Figure 10:
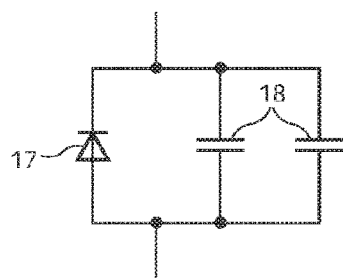
FIG. 10 shows an equivalent circuit diagram of the semiconductor chip in accordance with the exemplary embodiment in FIG. 9.

FIG. 10 shows an equivalent circuit diagram for the semiconductor chip 1 in accordance with FIG. 9. The first and second capacitive elements here are symbolized in each case by a capacitor symbol 18, and the pn junction 5 is symbolized by the diode symbol 17. The first capacitive element and the second capacitive element are in each case connected in parallel with one another and in parallel with the pn junction 5.

Figure 11:
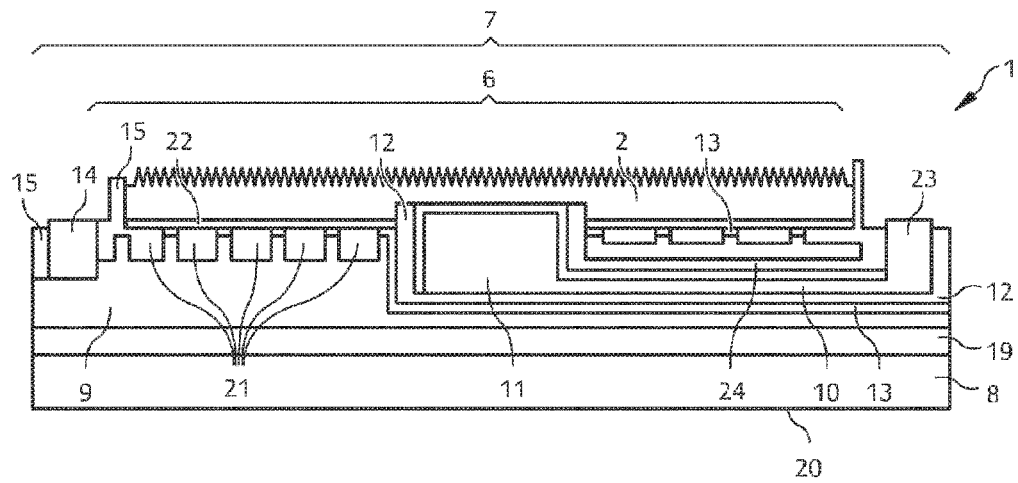
FIG. 11 shows a schematic sectional illustration of a semiconductor chip in accordance with a further exemplary embodiment.

In contrast to the optoelectronic semiconductor chip in accordance with the exemplary embodiment in FIG. 9, the optoelectronic semiconductor chip 1 in accordance with the exemplary embodiment in FIG. 11 comprises an insulating carrier 8. The electrically insulating carrier 8 can, for example, comprise aluminum nitride or be formed from aluminum nitride. In contrast to the semiconductor chip 1 in accordance with FIG. 9, therefore, the semiconductor chip 1 cannot be electrically contacted via its rear side 20. For this reason, the optoelectronic semiconductor chip 1 in accordance with FIG. 11 comprises, alongside the second connection element 23, a first connection element 14, which is arranged on a front side 7 of the semiconductor chip 1 and is in direct contact with the first contact layer 9. The first connection element 14 is provided for electrically contacting the first contact externally.

Figure 12:
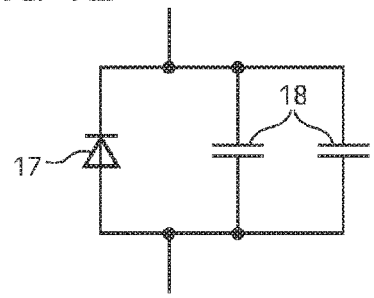
FIG. 12 shows an equivalent circuit diagram of the semiconductor chip in accordance with the exemplary embodiment in FIG. 11.

FIG. 12 shows an equivalent circuit diagram for the semiconductor chip 1 in accordance with FIG. 11. Here the first and second capacitive elements are symbolized in each case by a capacitor symbol 18, and the pn junction 5 is symbolized by the diode symbol 17. The first capacitive element and the second capacitive element are in each case connected in parallel with one another and in parallel with the pn junction 5.

Figure 13:
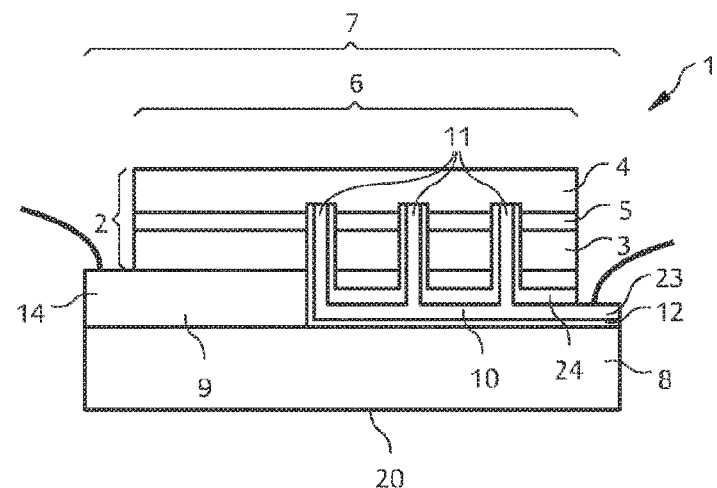
FIGS. 13, 14 and 15 show in each case a schematic sectional illustration of a semiconductor chip in accordance with in each case a further exemplary embodiment.

In contrast to the semiconductor chip 1 in accordance with the exemplary embodiment in FIG. 11, the second contact of the semiconductor chip 1 in accordance with the exemplary embodiment in FIG. 13 comprises a multiplicity of second contact elements 11, which in each case completely penetrate through the first contact layer 9 and the pn junction 5. The remaining elements of the semiconductor chip 1 in accordance with FIG. 13 can be embodied as in the case of the semiconductor chip 1 in accordance with FIG. 11.

Figure 14:
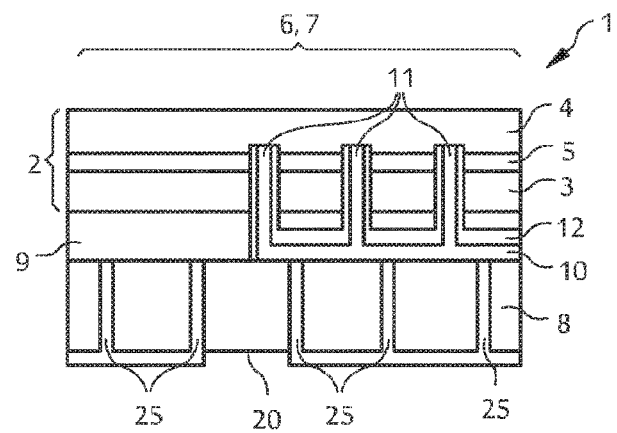

In contrast to the optoelectronic semiconductor chip 1 in accordance with FIG. 13, the optoelectronic semiconductor chip 1 in accordance with the exemplary embodiment in FIG. 14 comprises an electrically insulating carrier 8 having electrically conductive perforations 25. The semiconductor chip 1 can be electrically contacted on the rear side via the electrically conductive perforations 25. The semiconductor chip 1 is therefore free of a first connection element 14 and a second connection element 23. Therefore, the entire front side 7 of the semiconductor chip 1 can advantageously be utilized as radiation exit surface 6.

Figure 15:
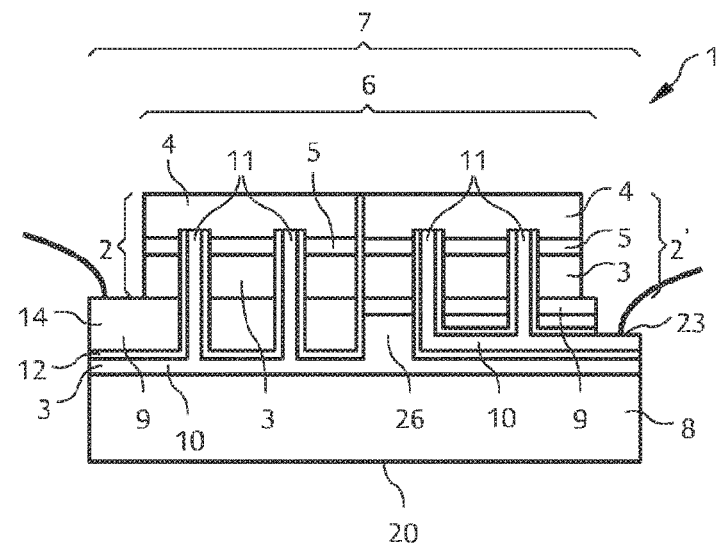
Figure 16:
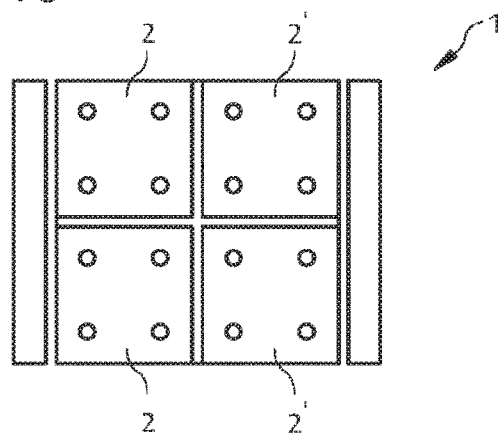
FIG. 16 shows a plan view of the semiconductor chip in accordance with FIG. 15.

The semiconductor chip 1 in accordance with the exemplary embodiment in FIGS. 15 and 16 comprises a plurality of laterally arranged semiconductor layer sequences 2, 2' positioned on a common carrier 8. In the present case, the semiconductor chip 1 comprises four semiconductor layer sequences 2, 2', which are monolithically integrated on the common carrier 8 and are electrically connected in series. The carrier 8 is embodied as electrically insulating.

Each semiconductor layer sequence 2, 2' has a first semiconductor region 3 of a first conductivity type and a second semiconductor region 4 of a second conductivity type. An active zone having a pn junction 5 is arranged between the first semiconductor region 3 and the second semiconductor region 4.

A first contact layer 9 of a first contact is arranged between a first semiconductor layer sequence 2 and the carrier 8, said first contact layer being in direct contact with the first semiconductor region 3 and being provided for electrically connecting the first semiconductor region 3. The first contact furthermore comprises a first connection element 14, which is arranged laterally with respect to the first semiconductor layer sequence 2.

Furthermore, a second contact layer 10 of a second contact is arranged between the carrier 8 and the first contact layer 9. The second contact layer 10 is in direct contact with the carrier 8 and is separated from the second contact layer 10 by a first dielectric layer 12. The second contact furthermore comprises two second contact elements 11, which completely penetrate through the first contact layer 9 and the pn junction 5. The first dielectric layer 12 extends right over the side flanks of the second contact elements 11.

The first dielectric layer 12 together with the first contact layer 9 and the second contact layer 10 forms a first dielectric element, which is connected in parallel with the pn junction 5 and is suitable for taking up at least part of the charge of the overvoltage in the case of an overvoltage in the reverse direction of the pn junction 5.

Laterally alongside the first semiconductor layer sequence 2, a second semiconductor layer sequence 2' is arranged on the carrier 8. The first semiconductor layer sequence 2 is electrically insulated from the second semiconductor layer sequence 2' by a dielectric layer.

Between the second semiconductor layer sequence 2' and the carrier 8, a first contact layer 9 is arranged in direct contact with the first semiconductor region 3. The first contact layer 9 is provided for electrically contacting the first semiconductor region 3.

Furthermore, a second contact layer 10 of a second contact is arranged between the first contact layer 9 and the carrier 8. The second contact furthermore comprises a second connection element 23 and two second contact elements 11, which completely penetrate through the first contact layer 9 and the pn junction 5 and are provided for electrically contacting the second semiconductor region 4.

Figure 17:
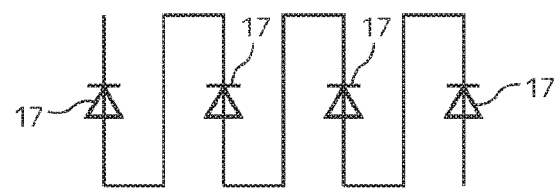
FIG. 17 schematically shows the electrical interconnection of the different semiconductor layer sequences of the semiconductor chip in accordance with FIGS. 15 and 16.

The second contact layer 10, which serves for electrically connecting the second semiconductor region 4 of the first adjacent semiconductor layer sequence 2, furthermore extends over the entire carrier 8 and is thus also arranged between the carrier 8 and the second contact layer 10 of the second semiconductor layer sequence 2'. From the second contact layer 10 of the first semiconductor layer sequence 2, an electrical connecting element 26 furthermore extends as far as the first contact layer 9 of the second semiconductor layer sequence 2'. The connecting element 26 is in direct contact with the first contact layer 9 of the second semiconductor layer sequence 2' and connects the second contact of the first semiconductor layer sequence 2 to the first contact of the second semiconductor layer sequence 2', such that the first semiconductor layer sequence 2 and the second semiconductor layer sequence 2' are connected in series (FIG. 17). The connecting element 26 has a region embodied as a layer that is arranged parallel to the first contact layer 9 of the second semiconductor layer sequence 2' and forms a common interface therewith.

A first dielectric layer is arranged between the second contact layer 10 of the first semiconductor layer sequence 2 and the second contact layer 10 of the second semiconductor layer sequence 2', said first dielectric layer electrically insulating the two second contact layers 10 from one another.

A further dielectric layer is arranged between the second contact layer 10 of the second semiconductor layer sequence 2' and the layer-shaped region of the connecting element 26, said further dielectric layer electrically insulating the connecting element 26 from the second contact layer 10. The side flanks of the second contact elements 11 are also completely covered by a dielectric layer.

Figure 18:
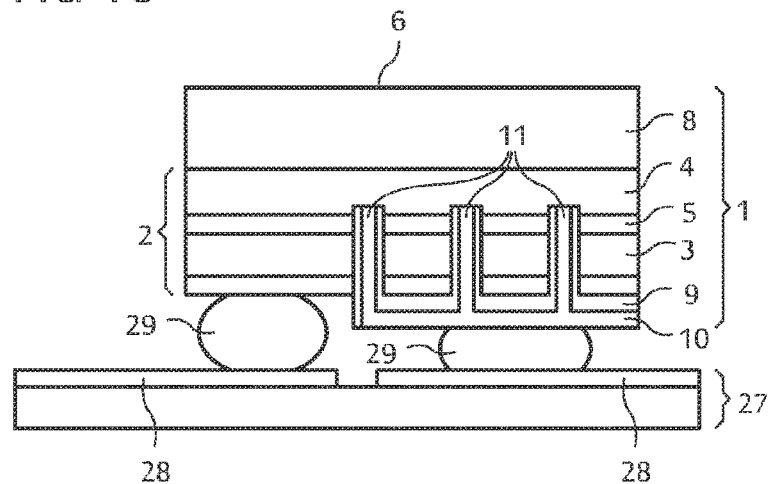
FIG. 18 shows a schematic sectional illustration of a component in accordance with a first exemplary embodiment.
Figure 19:
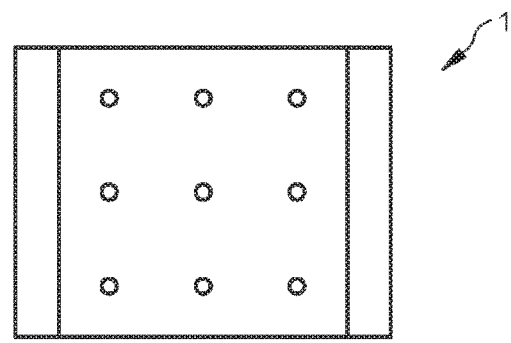
FIG. 19 shows a schematic plan view of the component in accordance with FIG. 18.

The optoelectronic component in accordance with the exemplary embodiment in FIGS. 18 and 19 comprises an optoelectronic semiconductor chip 1 applied to a submount 27.

The optoelectronic semiconductor chip 1 comprises a semiconductor layer sequence 2 having a first p-doped semiconductor region 3 and a second semiconductor region 4, which is n-doped in the present case. An active zone having a pn junction 5 is arranged between the n-doped semiconductor region 4 and the p-doped semiconductor region 3.

The semiconductor layer sequence 2 is grown epitaxially on a growth substrate, which in the present case serves as carrier 8 of the semiconductor chip 1. The semiconductor chip 1 is arranged on the submount 27 in such a way that the semiconductor layer sequence 2 faces away from the submount 27 and a main surface of the carrier 8 is provided as the radiation exit surface 6 of the semiconductor chip 1. In the present exemplary embodiment the carrier 8 is embodied in a radiation-transmissive fashion. By way of example, the carrier 8 is formed from sapphire.

A first contact layer 9 is applied to the semiconductor layer sequence 2, said first contact layer being provided for electrically contacting the p-doped semiconductor region 3. Furthermore, the semiconductor chip 1 comprises a second contact layer 10 and a multiplicity of second contact elements 11 for electrically connecting the second semiconductor region 4.

A first dielectric layer 12 is arranged between the first contact layer 9 and the second contact layer 10, said first dielectric layer extending over the side flanks of the second contact elements 11. The first dielectric layer 12 together with the first contact layer 9 and the second contact layer 10 forms a first capacitive element. The first capacitive element is connected in parallel with the pn junction 5 and is suitable for taking up charge of an overvoltage in the reverse direction of the pn junction 5.

The submount 27 has two bonding pads 28, which are electrically insulated from one another. The first bonding pad 28 is connected to the first contact layer by means of a bump 29. The second bonding pad 28 is likewise electrically conductively connected to the first contact layer 9 by means of a bump 29.

The submount 27 contains a further capacitive element, which likewise contributes to the ESD protection of the component. The further capacitive element is not illustrated in FIG. 18 for reasons of clarity. Embodiments of the further capacitive element in the submount 27 are described in detail further below in the text with reference to FIGS. 21 and 22.

Figure 20:
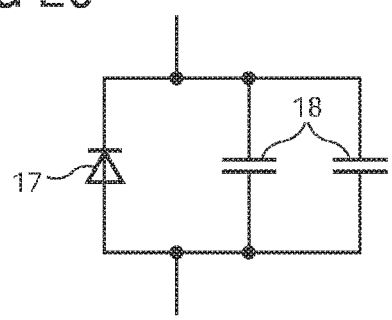
FIG. 20 shows an equivalent circuit diagram of the optoelectronic component in accordance with FIGS. 18 and 19.

An equivalent circuit diagram of the optoelectronic components in accordance with the exemplary embodiment in FIGS. 18 and 19 is illustrated in FIG. 20. The further capacitive element within the submount 27, the first capacitive element of the semiconductor chip 1 and the pn junction 5 are connected in parallel with one another.

Figure 21:
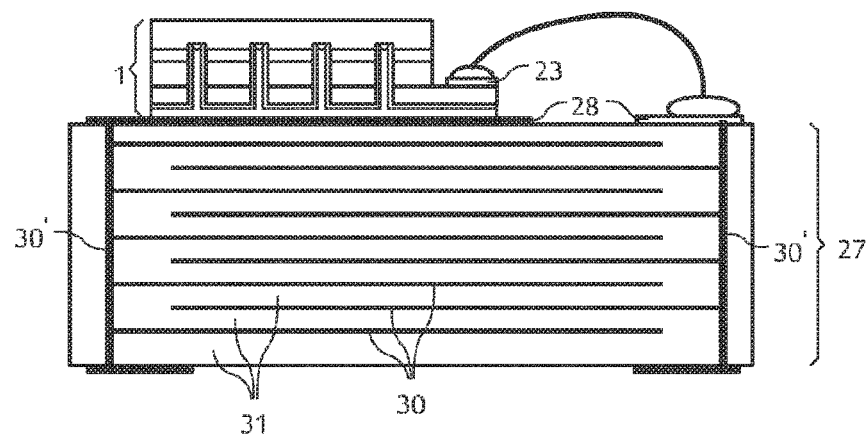
FIGS. 21 and 22 show in each case a schematic sectional illustration through a component in accordance with a respective exemplary embodiment.

The optoelectronic component in accordance with the exemplary embodiment in FIG. 21 comprises an optoelectronic semiconductor chip 1 such as has already been described in detail, for example, with reference to FIG. 8. The semiconductor chip is applied to a submount 27. The submount 27 has a first bonding pad 28 and a second bonding pad 28. The semiconductor chip 1 is electrically conductively connected to the first bonding pad 28 via its rear side. Furthermore, the second connection element 23 is electrically conductively connected to the second bonding pad 28 by means of a bonding wire.

In the present case, the submount 27 has electrically conductive structures formed from a metal. The electrically conductive structures comprise metallic layers 30 which are arranged parallel to a main surface of the submount and which are separated from one another by layers 31 of a dielectric material. The layer stack comprising alternating metallic layers 30 and dielectric layers 31 forms an capacitive element within the submount 27. Furthermore, two metallic, electrically conductive layers 30' are formed within the submount 27 and in each case extend in a manner proceeding from a bonding pad 28 perpendicular to a stacking direction of the layer stack along the side surfaces of the submount 27. Each electrically conductive layer 31 of the layer stack is furthermore connected to a single electrically conductive layer 30' arranged perpendicular to a side surface of the submount 27.

Figure 22:
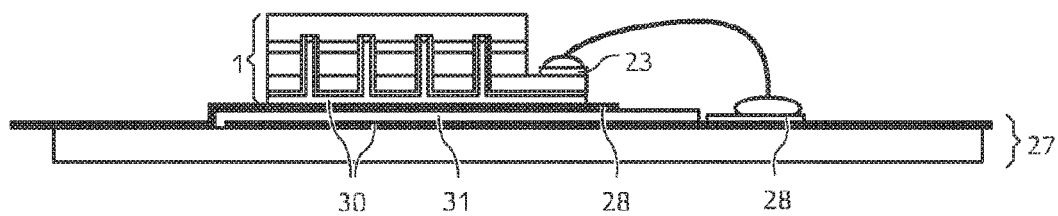

The optoelectronic component in accordance with the exemplary embodiment in FIG. 22 likewise comprises an optoelectronic semiconductor chip 1 such as has already been described with reference to FIG. 8. This semiconductor chip 1 is also applied to a submount 27 having a first bonding pad 28 and a second bonding pad 28. Furthermore, the submount 27 comprises a capacitive element, which, in contrast to the submount in accordance with FIG. 21, however, is formed by a single dielectric layer 31 between two electrically conductive layers 30. This capacitive element is situated on a first main surface of the submount 27 and faces toward the rear side 20 of the semiconductor chip 1.

Figure 23:
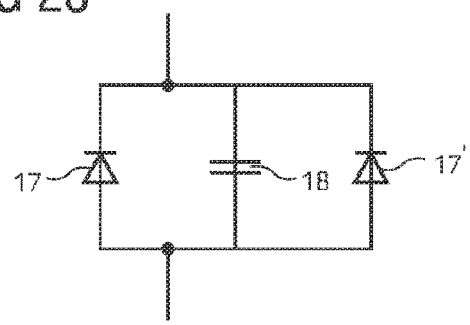
FIG. 23 shows an equivalent circuit diagram of a component in accordance with a further exemplary embodiment.

Furthermore, it is also possible for an additional external protective element, such as a protective diode, for example, to be provided in an optoelectronic component. The equivalent circuit diagram in the arrangement of this type is illustrated schematically in FIG. 23. In this case, the pn junction 5 is symbolized by a first diode symbol 17, while the external protective element, such as a protective diode, is identified by a second diode symbol 17', which, however, is connected in the reverse direction with respect to the first diode symbol 17. The additional capacitance of the capacitive element in the submount 27 or in the optoelectronic semiconductor chip 1 is symbolized by a capacitor symbol 18. In this case, the capacitor 18 is connected in parallel with the diodes 17, 17'.

Figure 24:
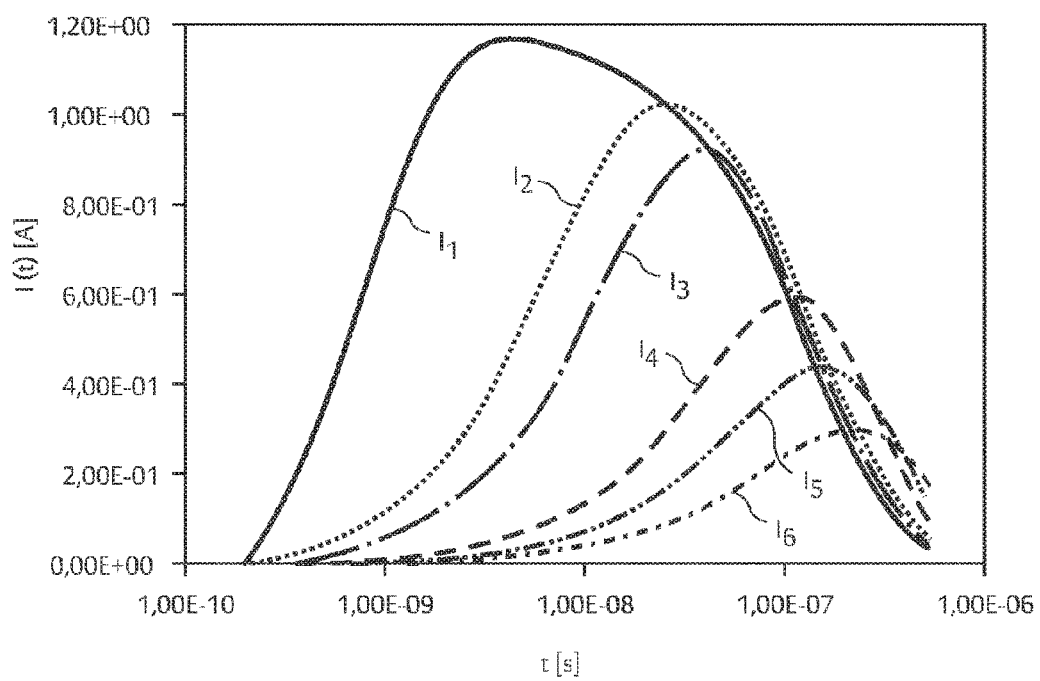
FIG. 24 shows simulation results for the current flow I(t) as a function of time at a light emitting diode (LED) in a circuit as illustrated schematically in the equivalent circuit diagram in FIG. 25.
Figure 25:
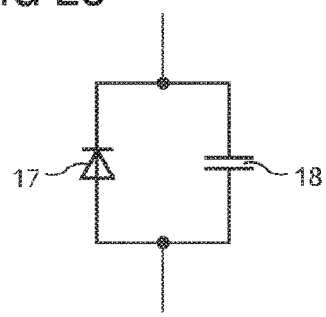

FIG. 24 shows various simulation results for the time dependence of the current I(t) present at a semiconductor chip 1 such as has already been described. The equivalent circuit diagram used as a basis for the simulation is illustrated in FIG. 25 and corresponds to the equivalent circuit diagram in FIGS. 5 and 7.

In this case, the various curves $I_1(t)$ to $I_6(t)$ show the time dependence of the current I(t) flowing via the pn junction 5 in the case of variation of the capacitance C in the circuit.

The capacitance has a value of 50 picofarads in the case of the curve $I_1(t)$, a value of 500 picofarads in the case of the curve $I_2(0$, a value of 1 nanofarad in the case of the curve $I_3(t)$, a value of 5 nanofarads in the case of the curve $I_4(t)$, a value of 10 nanofarads in the case of the curve $I_5(t)$ and a value of 20 nanofarads in the case of the curve $I_6(t)$. As the capacitance increases, firstly the maximum value of the current flowing away via the pn junction 5 decreases. Furthermore, the rise in the current to the maximum value also slows down as the capacitance rises. Therefore, the pn junction 5 is subjected to less current significantly more slowly in the case of high capacitances than in the case of low capacitances.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. An optoelectronic semiconductor chip comprising:
    a semiconductor layer sequence having a first semiconductor region of a first conductivity type, a second semiconductor region of a second conductivity type, and an active zone having a pn junction, the active zone formed between the first semiconductor region and the second semiconductor region;
    a carrier, wherein the semiconductor layer sequence is arranged on the carrier;
    a first contact electrically connected to the first semiconductor region;
    a second contact electrically connected to the second semiconductor region, the second contact being different than the first contact; and
    a first capacitive electrical element connected in parallel with the pn junction, the first capacitive element being formed of a single first dielectric layer that is suitable for taking up charge in case of an overvoltage in a reverse direction of the pn junction,
    wherein the single first dielectric layer has a thickness between 1 nanometer and 1000 nanometers, inclusive, and
    wherein the single first dielectric layer is a layer selected from the group consisting essentially of hafnium nitride, hafnium oxynitride, hafnium silicon oxynitride, zirconium oxynitride, zirconium silicon oxynitride, tantalum oxide, barium strontium titanate, strontium titanate, hafnium oxide, aluminum oxide and zirconium oxide.

2. The optoelectronic semiconductor chip according to claim 1, wherein the first contact and the second contact are electrically isolated from one another by the first dielectric layer.

3. The optoelectronic semiconductor chip according to claim 1, further comprising a second capacitive element comprising a second dielectric element.

4. The optoelectronic semiconductor chip according to claim 3, wherein the second capacitive element comprises a second dielectric layer.

5. The optoelectronic semiconductor chip according to claim 1, wherein:
    the first contact comprises a first contact layer and the second contact comprises a second contact layer;
    the first contact layer, the second contact layer and the first dielectric layer are arranged one above another; and
    the first dielectric layer is arranged between the first contact layer and the second contact layer.

6. The optoelectronic semiconductor chip according to claim 1, wherein the first contact comprises a first contact layer and the second contact comprises a second contact element that extends through the first contact layer and the pn junction.

7. The optoelectronic semiconductor chip according to claim 6, wherein the first dielectric layer covers a side flank of the second contact element.

8. The optoelectronic semiconductor chip according to claim 6, further comprising a second capacitive element that comprises a second dielectric layer that covers a side flank of the second contact element.

9. The optoelectronic semiconductor chip according to claim 1, further comprising a second capacitive element that comprises a second dielectric layer;
    wherein the first contact comprises a first contact layer and the second contact comprises a second contact layer;
    wherein the first contact layer and the second contact layer are arranged one above another;
    wherein the first dielectric layer is arranged between the first contact layer and the second contact layer; and
    wherein the second dielectric layer is arranged between the second contact layer and the semiconductor layer sequence.

10. The optoelectronic semiconductor chip according to claim 1, wherein the first contact comprises a first connection element that is arranged on a front side of the optoelectronic semiconductor chip.

11. The optoelectronic semiconductor chip according to claim 10, wherein the second contact comprises a second connection element that is arranged on the front side of the optoelectronic semiconductor chip.

12. The optoelectronic semiconductor chip according to claim 1, wherein the optoelectronic semiconductor chip comprises a plurality of semiconductor layer sequences that are arranged laterally on the carrier and connected in series with one another.

13. The optoelectronic semiconductor chip according to claim 1, wherein the carrier is radiation-transmissive and a main surface of the carrier comprises a radiation exit surface.

14. The optoelectronic semiconductor chip according to claim 1, wherein the carrier faces away from a radiation exit surface of the optoelectronic semiconductor chip.

15. An optoelectronic component comprising the optoelectronic semiconductor chip of claim 1 and a submount, the optoelectronic semiconductor chip being applied to the submount, wherein a further capacitive element is integrated into the submount.

16. The optoelectronic component according to claim 15, wherein the further capacitive element comprises a dielectric layer.

17. The optoelectronic component according to claim 15, wherein the further capacitive element comprises a layer stack of alternating metallic layers and dielectric layers.

18. The optoelectronic semiconductor chip of claim 1, wherein the active zone is configured to emit electromagnetic radiation.

* * * * *